United States Patent
Wang et al.

(10) Patent No.: US 8,508,515 B2
(45) Date of Patent: Aug. 13, 2013

(54) BUFFERING CIRCUIT WITH REDUCED DYNAMIC POWER CONSUMPTION

(75) Inventors: Jia-Hui Wang, Tainan (TW); Chien-Hung Tsai, Tainan (TW); Ying-Lieh Chen, Tainan (TW); Chin-Tien Chang, Tainan (TW)

(73) Assignees: Himax Technologies Limited, Tainan (TW); NCKU Research and Development Foundation, Tainan (TW)

( * ) Notice: Subject to any disclaimer, the term of this patent is extended or adjusted under 35 U.S.C. 154(b) by 1042 days.

(21) Appl. No.: 12/536,050

(22) Filed: Aug. 5, 2009

(65) Prior Publication Data
US 2011/0032240 A1 Feb. 10, 2011

(51) Int. Cl.
*G06F 3/038* (2013.01)

(52) U.S. Cl.
USPC ............. 345/204; 345/55; 345/214; 345/100; 330/250

(58) Field of Classification Search
USPC .................... 345/55, 204–205, 214, 87, 100; 330/250–255, 257, 127
See application file for complete search history.

(56) References Cited

U.S. PATENT DOCUMENTS

| | | | | |
|---|---|---|---|---|
| 6,163,217 A * | 12/2000 | Matsubara et al. | ........... | 330/255 |
| 6,614,295 B2 * | 9/2003 | Tsuchi | ........... | 327/563 |
| 7,057,459 B2 * | 6/2006 | Ueno | ........... | 330/255 |
| 7,224,224 B2 * | 5/2007 | Sera et al. | ........... | 330/253 |
| 7,385,581 B2 * | 6/2008 | Kojima et al. | ........... | 345/96 |
| 7,545,305 B2 * | 6/2009 | Tsuchi | ........... | 341/144 |
| 7,570,116 B2 * | 8/2009 | Haila et al. | ........... | 330/264 |
| 7,573,455 B2 * | 8/2009 | Kim | ........... | 345/100 |
| 7,760,019 B2 * | 7/2010 | Johansson | ........... | 330/252 |
| 7,821,340 B2 * | 10/2010 | Lin et al. | ........... | 330/264 |
| 7,834,693 B2 * | 11/2010 | Lee et al. | ........... | 330/255 |
| 2005/0156863 A1 * | 7/2005 | Kim | ........... | 345/100 |
| 2005/0200586 A1 * | 9/2005 | Kojima et al. | ........... | 345/96 |
| 2007/0139350 A1 * | 6/2007 | Kawaguchi et al. | ........... | 345/100 |

* cited by examiner

*Primary Examiner* — Jason Mandeville
(74) *Attorney, Agent, or Firm* — Baker & McKenzie LLP (57) ABSTRACT

A buffering circuit with reduced power consumption is provided. The output buffering circuit includes first and second amplifier circuits. The first amplifier circuit includes a first input stage and a first output stage both coupled between a first power voltage and a second power voltage lower than the first power voltage, and an assistant discharging unit configured to provide a discharging current flowing from a first output node to a first intermediate power voltage during a discharging operation of the first amplifier circuit. The second amplifier circuit includes a second input stage and a second output stage both coupled between the first power voltage and the second power voltage, and an assistant charging unit configured to provide a charging current flowing from a second intermediate power voltage to a second output node during a charging operation of the second amplifier circuit. The first and second amplifier circuits can have reduced output voltage ranges and hence reduced total power consumption.

21 Claims, 11 Drawing Sheets

BUFFERING CIRCUIT WITH REDUCED DYNAMIC POWER CONSUMPTION

BACKGROUND

1. Technical Field

The embodiments described herein relate to a display device, and more particularly, to an output buffering circuit for a driver device, an amplifier circuit, and a display device employing the output buffering circuit.

2. Description of the Related Art

In general, a source driver chip for a display system includes several hundreds of source driving circuits, each for driving at least one source line of the panel in the display system. The power consumption of a single source driving circuit therefore has a large impact on the whole source driver chip. A source driving circuit generally includes an output buffer which takes a large part in the total power consumption and operating speed of the source driving circuit. For a portable electronic product, an output buffer that consumes less power can extend the life of the batteries. On the other hand, for applications of large-size LCDs (liquid crystal displays) that accompany relatively large panel loads and strict system specifications, power consumption is often considerable, which results in over-heating in the source driver chip and shortens the life of the source driver chip. A low-power output driver is desirable for solving the over-heating problem and prolonging the life of the source driver chip. Accordingly, low-power output drivers have become a mainstream in the current design trend.

Figure 1:
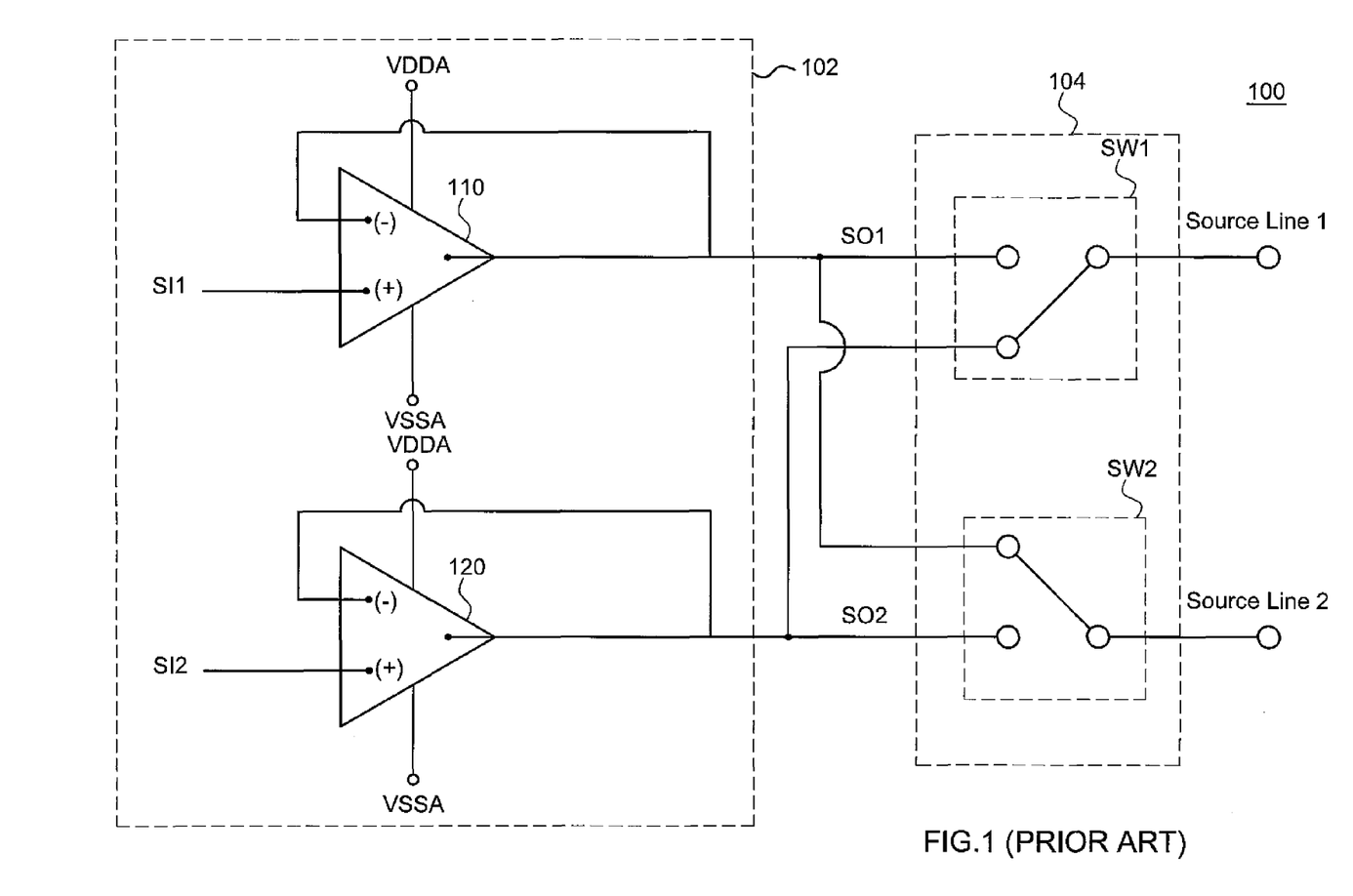
FIG. 1 is a schematic diagram of a conventional source driver device.

FIG. 1 is a schematic diagram of a conventional source driver device. In FIG. 1, a conventional source driving circuit 100 includes an output buffering circuit 102 and a switching circuit 104.

The output buffer circuit 102 includes a first amplifier circuit 110 and a second amplifier circuit 120. Typically, the first amplifier circuit 110 includes an input stage (not shown) for receiving a first input signal SI1, and an output stage (not shown) for providing the first output signal SO1. Both of the input and output stages are coupled between a first power voltage VDDA and a second power voltage VSSA lower than VDDA. Similarly, the second amplifier circuit 120 typically includes an input stage (not shown) for receiving a second input signal SI2, and an output stage (not shown) for providing the second output signal SO2. Also, both of the input and output stages are coupled between the first power voltage VDDA and the second power voltage VSSA. Accordingly, the first and second amplifier circuits 110 and 120 are both able to drive a display panel within an output voltage range between VSSA and VDDA. The switching circuit 104 includes a first switch SW1 and a second switch SW2 that can be switched such that the first and second amplifier circuits 110 and 120 can alternatively drive different source lines on the display panel.

For the abovementioned and other reasons, to reduce the total power consumption of the conventional output buffer, especially the dynamic power consumption in charging and discharging process, in consideration of meeting other requirements such as sufficient driving ability for the display panel, simplicity of design and manufacture, and/or other characteristics of circuit structure and operation, has become an important development issue.

SUMMARY

The present application describes an output buffering circuit for a driver device, an amplifier circuit, and a display device employing the output buffering circuit with reduced dynamic power consumption.

According to one aspect, a buffering circuit of a driver device for a display device includes first and second amplifier circuits. The first amplifier circuit includes a first input stage coupled between a first power voltage and a second power voltage lower than the first power voltage, a first output stage coupled between the first power voltage and the second power voltage and having a first output node, and an assistant discharging unit coupled between the first output node and a first intermediate power voltage higher than the second power voltage. The assistant discharging unit is configured to provide a discharging current flowing from the first output node to the first intermediate power voltage during a discharging operation of the first amplifier circuit. The second amplifier circuit includes a second input stage coupled between the first power voltage and the second power voltage, a second output stage coupled between the first power voltage and the second power voltage and having a second output node, and an assistant charging unit coupled between the second output node and a second intermediate power voltage lower than the first power voltage. The assistant charging unit is configured to provide a charging current flowing from the second intermediate power voltage to the second output node during a charging operation of the second amplifier circuit.

According to another aspect, an output buffering circuit of a driver device for a display includes first and second amplifier circuits. The first amplifier circuit includes a first output stage having a first discharging path coupled between a first output node and a first intermediate power voltage higher than the second power voltage, and a first charging path coupled between the first output node and the first power voltage. The second amplifier circuit includes a second input stage coupled between the first power voltage and the second power voltage, and a second output stage having a second charging path coupled between a second output node and a second intermediate power voltage lower than the first power voltage, and a second discharging path coupled between the second output node and the second power voltage.

These and other features, aspects, and embodiments are described below in the circuit entitled "Detailed Description."

BRIEF DESCRIPTION OF THE DRAWINGS

Features, aspects, and embodiments are described in conjunction with the attached drawings, in which.

DETAILED DESCRIPTION

Figure 2:
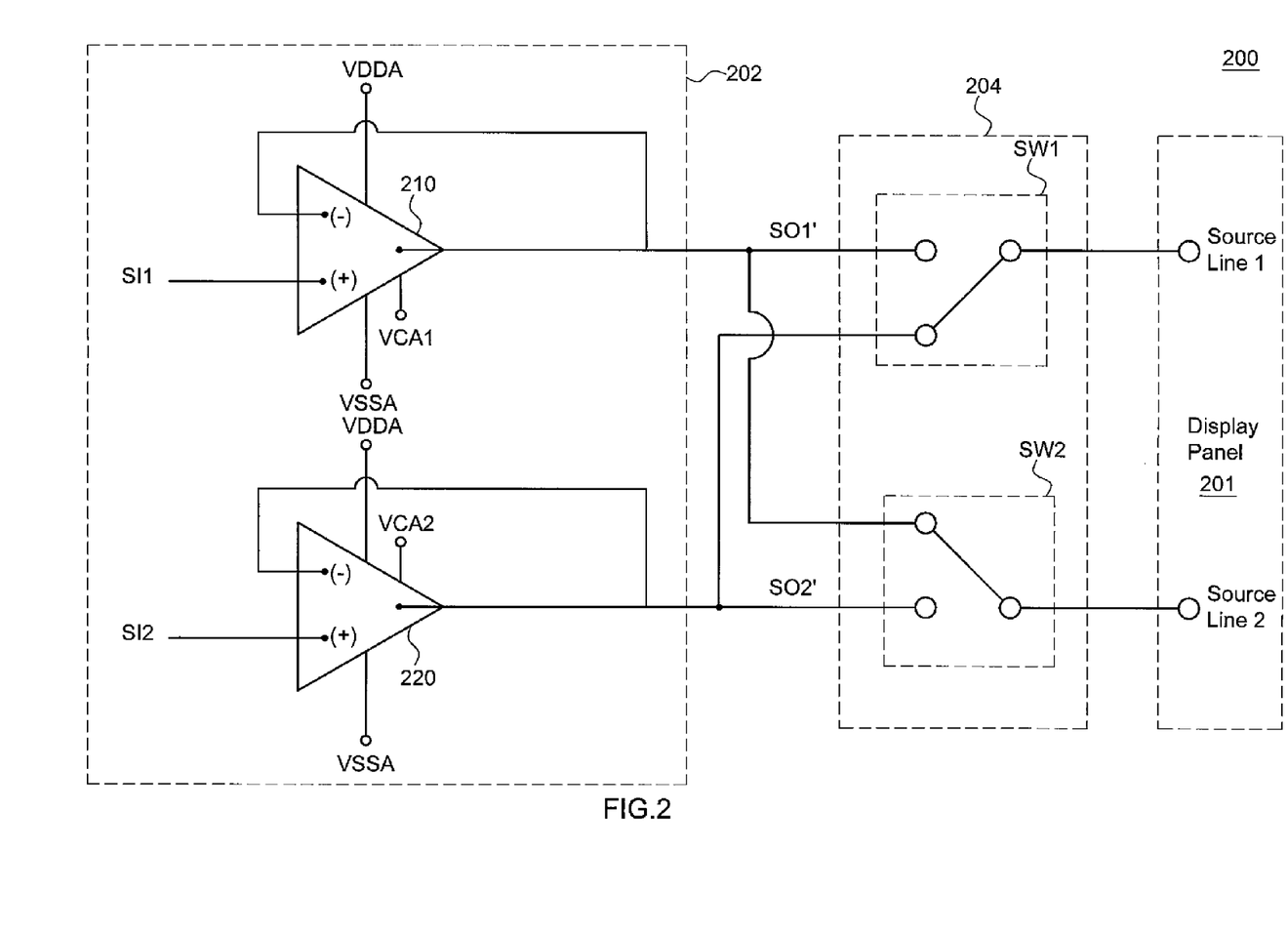
FIG. 2 is a schematic diagram of an exemplary source driver device according to one embodiment.

FIG. 2 is a schematic diagram of an exemplary source driver device according to one embodiment. In FIG. 2, a source driver device 200 can be configured to drive a display panel 201, and can include an output buffering circuit 202 and a switching circuit 204.

The output buffering circuit 202 can include a first amplifier circuit 210 and a second amplifier circuit 220. The first amplifier circuit 210 can receive a first input signal SI1 from, for example, a D/A converter (not shown), and then provide a first output signal SO1' for driving the display panel 201 according to the first input signal SI1. Similarly, the second amplifier circuit 220 can receive a second input signal SI2 and then provide a second output signal SO2' for driving the display panel 201 according to the second input signal SI2.

The switching circuit 204 can be configured to control the coupling between the first and second amplifier circuits 210 and 220 and the display panel 201. In one embodiment, the first amplifier circuit 210 is used to output the first output signal SO1' of a positive polarity, that is, SO1' is within a positive potential range from a first power voltage VDDA to (VDDA+VSSA)/2, wherein VSSA is a second power voltage lower than the first power voltage. The second amplifier circuit 220 is used to output the second output signal SO2' of a negative polarity, that is, SO2' is within a negative potential range from (VDDA+VSSA)/2 to the second power voltage VSSA. As an example, the switching circuit 204 can be implemented as a multiplexer comprising a first switch SW1 and a second switch SW2 that are switched such that each of the output signals SO1' and SO2' issued from the first and second amplifier circuits 210 and 220 can be used to drive a different source line on the display panel 201.

Compared to the first amplifier circuit 110 in the conventional source driver device 100 of FIG. 1, the first amplifier circuit 210 is not only coupled between the first power voltage VDDA and the second power voltage VSSA, but is also coupled to a first intermediate power voltage VCA1. The level of the first intermediate power voltage VCA1 is preferably greater than the level of the second power voltage VSSA, that is, between VSSA and VDDA, and more preferably between VDDA and a voltage equal to or less than (VDDA+VSSA)/2. With such allocation of power voltages, the first amplifier circuit 210 can discharge the display panel 201 to the level of the first intermediate power voltage VCA1 rather than to the level of the second power voltage VSSA during a discharging operation. In other words, the first amplifier circuit 210 can provide a discharging current flowing from the display panel 201 to the first intermediate power supply VCA1 rather than (or additionally) to the second power voltage VSSA during a discharging operation. As a result, the output voltage range is smaller, which leads to less dynamic power consumption than the conventional first amplifier circuit 110. More details are later explained with reference to the two different embodiments illustrated in FIGS. 3A and 5A.

Similarly, compared to the second amplifier circuit 120 in the conventional source driver device 100 of FIG. 1, the second amplifier circuit 220 is not only coupled between the first power voltage VDDA and the second power voltage VSSA, but is also coupled to a second intermediate power voltage VCA2. The level of the second intermediate power voltage VCA2 is preferably lower than the level of the first power voltage VDDA, that is, between VSSA and VDDA, and more preferably between VSSA and a voltage equal to or greater than (VDDA+VSSA)/2. In a more preferable embodiment, the first and second intermediate power voltages VCA1 and VCA2 can be both substantially equal to (VDDA+VSSA)/2. For example, the output stages of the first and second amplifier circuits 210 and 220 can share a common power voltage that is median to the first and second power voltages. With this allocation of power voltages, during a charging operation, the second amplifier circuit 220 can provide a charging path for the display panel 201 from the level of the second intermediate power voltage VCA2 (rather than from the conventional level of the first power voltage VDDA) to the second power voltage VSSA. As a result, the second amplifier circuit 220 has a smaller output voltage range, resulting in less dynamic power consumption than the conventional second amplifier circuit 120. More details are later explained by two different embodiments illustrated by FIGS. 3B and 5B.

Because the dynamic power consumption for the discharge of the first amplifier circuit 210 and the charging of the second amplifier circuit 220 can be reduced, the total power consumption of the source driver device 200 can be reduced compared with the conventional source driver device 100.

It is worth noting that while the output buffering circuit 202 and the switching circuit 204 are described in embodiments for driving a display panel, other applications may also be possible.

Additionally, the first and second amplifier circuits 210 and 220 can include unit-gain amplifiers, inverting amplifiers, or the like.

Figure 3A:
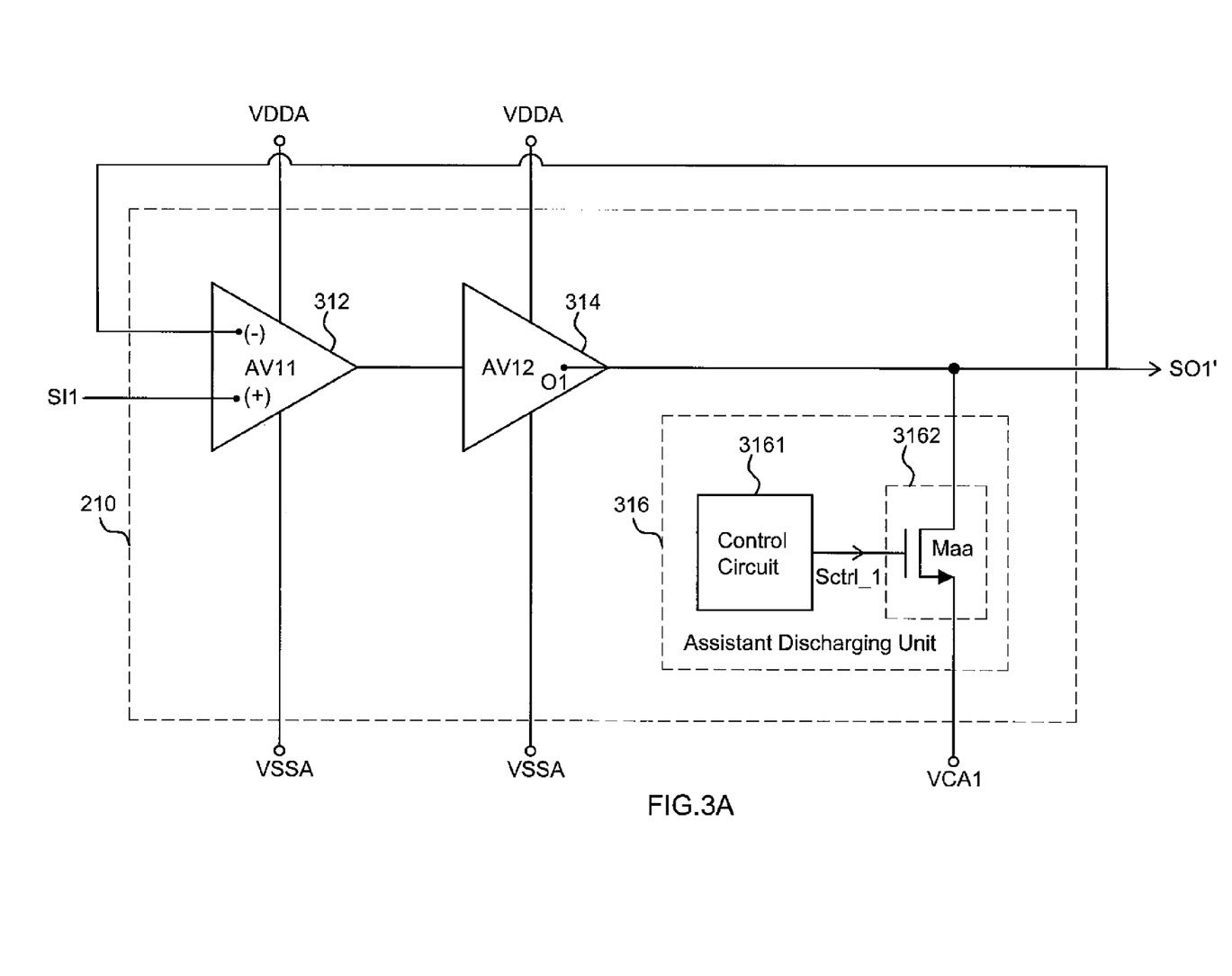
FIGS. 3A and 3B are more detailed schematic diagrams of first and second amplifier circuits of FIG. 2 in accordance with one embodiment.
Figure 3B:
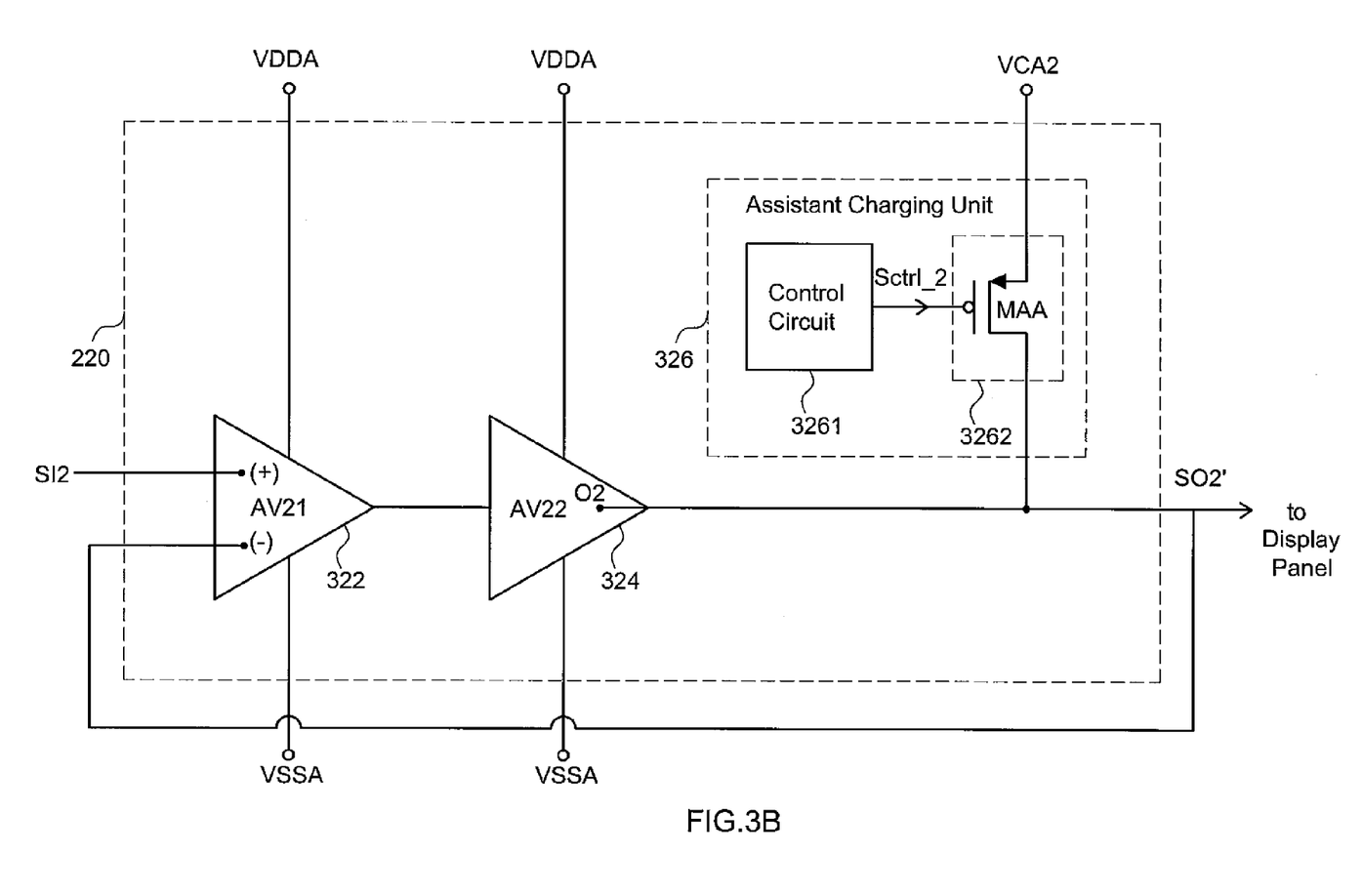

FIGS. 3A and 3B are schematic diagrams respectively illustrating embodiments of the first amplifier circuit 210 and the second amplifier circuit 220 of FIG. 2. Referring to FIG. 3A, the first amplifier circuit 210 can comprise a first input stage 312 ("AV11"), a first output stage 314 ("AV12"), and an assistant discharging unit 316.

The first input stage 312 is coupled between a first power voltage VDDA and a second power voltage VSSA lower than the first power voltage VDDA, and can include a non-inverting input node and an inverting input node. In one embodiment where the first amplifier circuit 210 is a unit-gain amplifier, the inverting input node can be coupled with the first input signal SI1 and the first output signal SO1', respectively.

In response to a signal from the first input stage 312, a first output node O1 of the first output stage 314 can provide the first output signal SO1' within a first output voltage range for driving the display panel. The first output stage 314 can be coupled between the first power voltage VDDA and the second power voltage VSSA. Moreover, the first output stage 314 can include a charging path (not shown) that is activated during a charging operation of the first amplifier circuit 210 to allow a charging current to flow from the first power voltage VDDA through the charging path to the display panel for charging the display panel. In some embodiments, the first output stage 314 can further include a discharging path (not shown) that is activated during a discharging operation of the first amplifier circuit 210 to allow a discharging current to flow from the display panel through the discharging path to the lower power voltage VSSA for discharging the display panel.

The assistant discharging unit 316 is coupled between the first output node O1 and a first intermediate power voltage VCA1 that is higher than the second power voltage VSSA. The assistant discharging unit 316 is configured to provide a discharging current flowing from the first output node O1 to the first intermediate power voltage VCA1 during a discharging operation of the first amplifier circuit 210.

In one embodiment, the assistant discharging unit 316 can include a control circuit 3161 and a discharging path 3162 that is coupled between the first output node O1 and the first intermediate power voltage VCA1. The discharging path 3162 is activated and deactivated by the control circuit 3161. When the discharging path 3162 is activated by the control circuit 3161 in a dynamic discharging mode of operation of the first amplifier circuit 210, a discharging current can flow from the display panel through the discharging path 3162 to the first intermediate power voltage VCA1 for discharging the display panel. Preferably, the discharging path 3162 can be deactivated by the control circuit 3161 in static operation and dynamic charging operation of the first amplifier circuit 210 for preventing unnecessary power consumption. As an example, the discharging path 3162 can comprise a NMOS transistor Maa having a gate controlled by a control signal Sctrl_1 from the control circuit 3161. With the first output stage 314 and the assistant discharging unit 316 respectively responsible for charging and discharging operations, the first amplifier circuit 210 can drive the display panel within a first output voltage range between the first intermediate power voltage VCA1 and the first power voltage VDDA.

Because the discharging path of the first amplifier circuit 210 is bounded between VCA1 and VDDA, power consumption can be advantageously reduced.

Referring now to FIG. 3B, the second amplifier circuit 220 can comprise a second input stage 322 ("AV21"), a second output stage 324 ("AV22"), and an assistant charging unit 326.

The second input stage 322 is coupled between the first power voltage VDDA and the second power voltage VSSA, and includes a non-inverting input node and an inverting input node. In one embodiment wherein the second amplifier circuit 220 is a unit-gain amplifier, the inverting input node can be coupled with the second input signal SI2 and the second output signal SO2', respectively.

In response to a signal from the second input stage 322, a second output node O2 of the second output stage 324 can provide the second output signal SO2' within a second output voltage range for driving the display panel. The second output stage 324 can be coupled between the first power voltage VDDA and the second power voltage VSSA. Moreover, the second output stage 324 can include a discharging path (not shown) that is activated during a discharging operation of the second amplifier circuit 220 to allow a discharging current to flow from the display panel through the second output stage 324 to the lower power voltage VSSA for discharging the display panel. In some embodiments, the first output stage 314 can include a charging path (not shown) that is activated during a charging operation of the second amplifier circuit 220 to allow a charging current to flow from the upper power voltage VDDA through the first output stage 314 to the display panel for charging the display panel.

The assistant charging unit 326 is coupled between the second output node O2 and a second intermediate power voltage VCA2 that is lower than the first power voltage VDDA. The assistant charging unit 326 is configured to provide a charging current that flows from the second intermediate power voltage VCA2 to the second output node O2 during a charging operation of the second amplifier circuit 220.

In one embodiment, the assistant charging unit 326 can include a control circuit 3261 and a charging path 3262 that is coupled between the second output node O2 and the second intermediate power voltage VCA2. The charging path 3262 is activated and deactivated by the control circuit 3261. When the charging path 3262 is activated by the control circuit 3261 in a dynamic charging mode of operation of the second amplifier circuit 220, a charging current can flow from the second intermediate power voltage VCA2 through the charging path 3262 to the display panel for charging the display panel. Preferably, the charging path 3262 can be deactivated in a static operation and dynamic discharging operation of the second amplifier circuit 220 for preventing unnecessary power consumption. As an example, the charging path 3262 can comprise a PMOS transistor MAA having a gate controlled by a control signal Sctrl_2 from the control circuit 3261. With the second output stage 324 and the assistant charging unit 326 respectively responsible for the discharging and charging operations, the second amplifier circuit 220 can drive the display panel within a second output voltage range between the second intermediate power voltage VCA2 and the second power voltage VSSA.

Because the charging path of the second amplifier circuit 220 is bounded between VCA2 and VSSA, power consumption can be advantageously reduced.

Figure 4A:
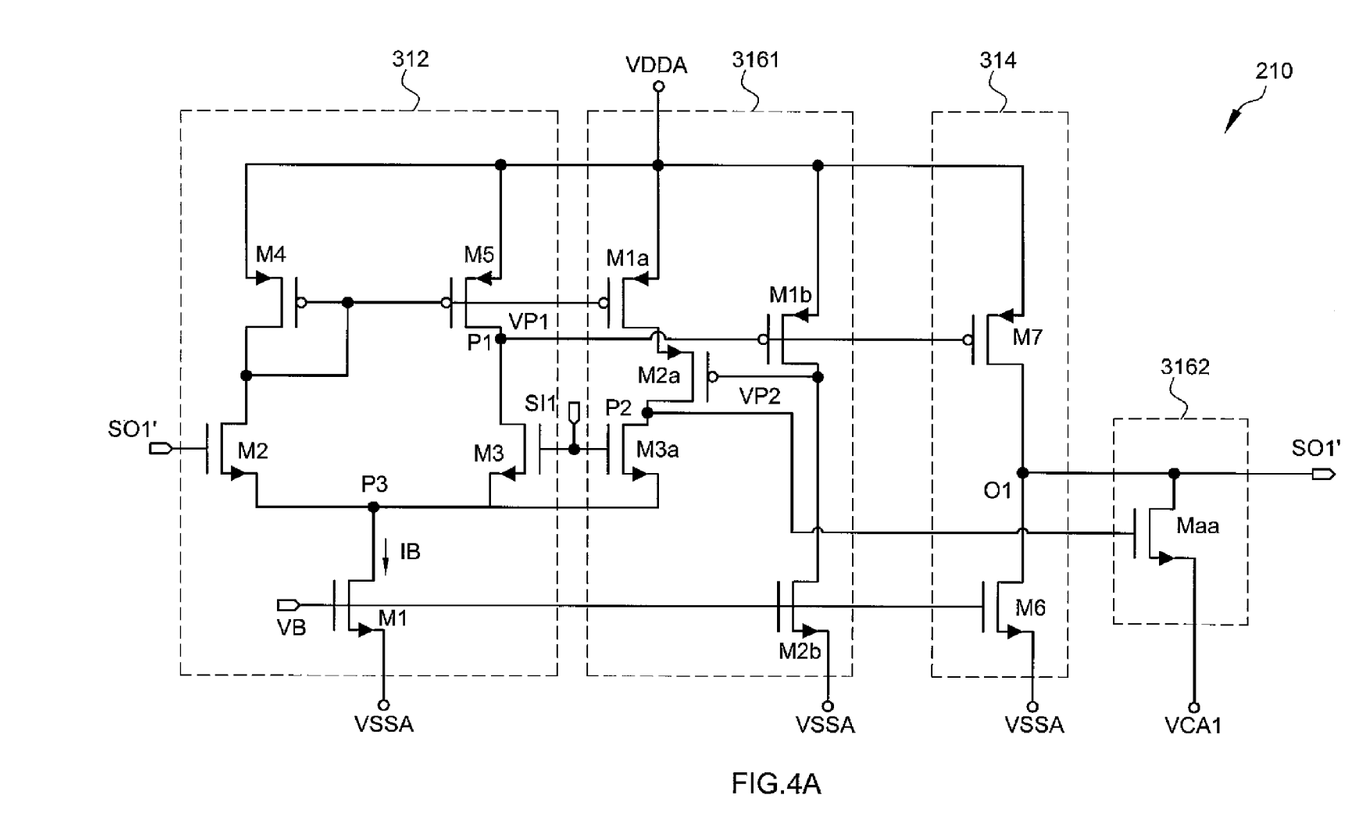
FIGS. 4A and 4B are circuit diagrams of the first amplifier circuit of FIG. 3A and the second amplifier circuit of FIG. 3B in accordance with one embodiment, respectively.
Figure 4B:
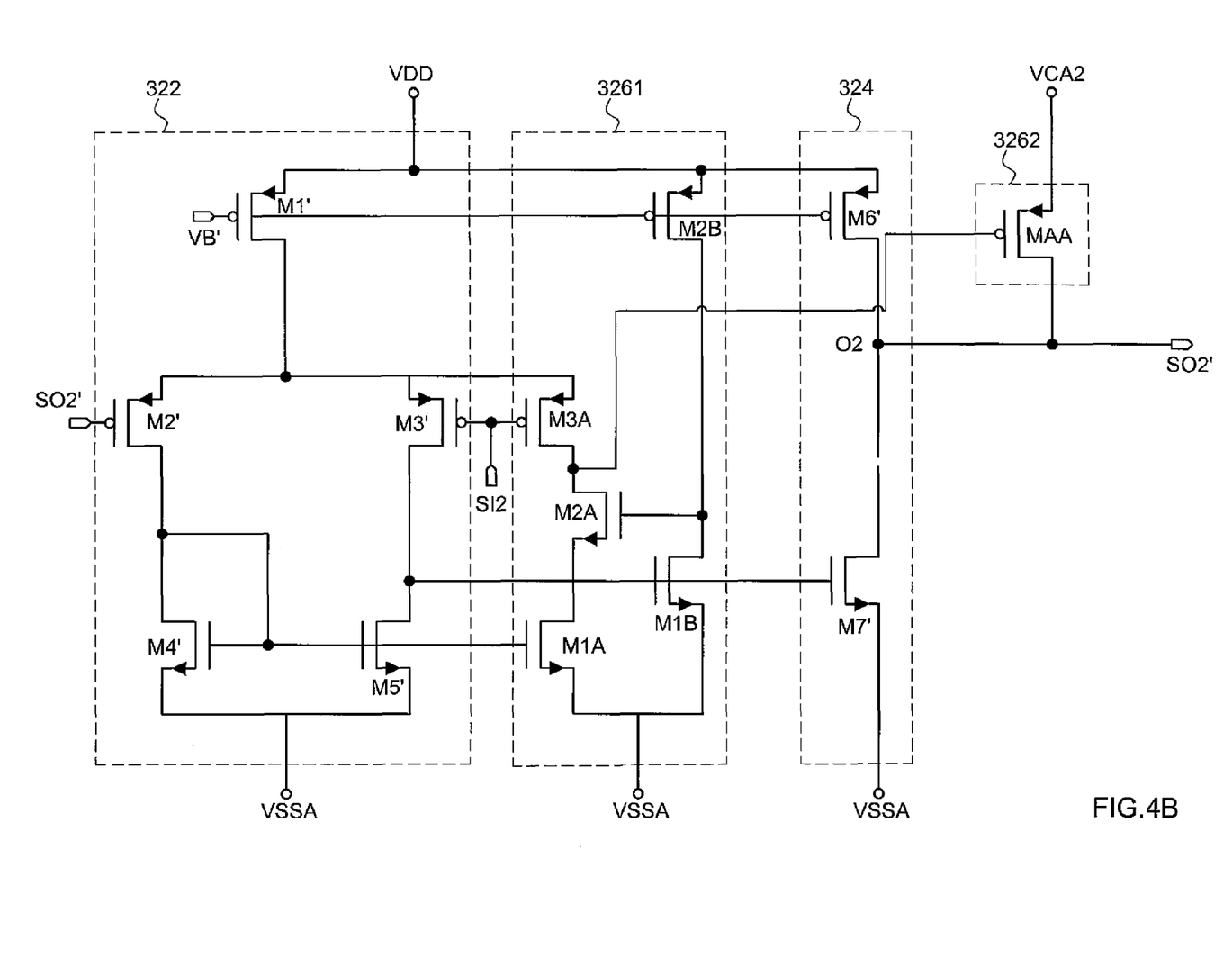

FIGS. 4A and 4B are circuit diagrams respectively illustrating an embodiment of the first amplifier circuit 210 shown in FIG. 3A and an embodiment of the second amplifier circuit 220 shown in FIG. 3B. Referring to FIG. 4A, the first input stage 312 of the first amplifier circuit 210 can include a differential pair configured to receive a differential signal (e.g., the first input signal SI1 and the first output signal SO1'), and provide an output voltage VP1 at a node P1 to the first output stage 314 and the control circuit 3161.

In one embodiment, the differential pair can include NMOS input transistors M2 and M3. The gates of the NMOS input transistors M2 and M3 may respectively receive the first output signal SO1' and first input signal SI1, the sources of the NMOS input transistors M2 and M3 are commonly connected with a current source providing a bias current IB, and the drains of the NMOS input transistors M2 and M3 are connected with an active load. In one embodiment, the current source can include a NMOS transistor M1 having a gate connected with a bias voltage VB, a source connected with the second power voltage VSSA, and a drain connected with the sources of the NMOS transistors M1 and M2. In one embodiment, the active load can include PMOS transistors M4 and M5 having drains connected with the first power voltage VDDA, gates connected together, and sources connected with the respective drains of the NMOS transistors M1 and M2.

The first output stage 314 can be configured to drive a display panel in response to the output voltage VP1 of the first input stage 312. In one embodiment, the output stage 314 can include a pair of complementary driver transistors M6 and M7 that are serially connected between the first power voltage VDDA and the second power voltage VSSA. More specifically, the gate of the transistor M7 can receive the output voltage VP1, the gate of the transistor M6 can receive the bias voltage VB, and the drains of the transistors M6 and M7 can be commonly connected with a first output node O1 through which a first output signal SO1' is issued.

In one embodiment, the control circuit 3161 can include PMOS transistors M1a and M2a, and a NMOS transistor M3a that are serially connected between the first power voltage VDDA and a node P3 of the first input stage 312. The gates of the PMOS transistor M1a and the NMOS transistor M3a are coupled with the gates of the PMOS transistor M5 and the NMOS transistor M3 in the first input stage 312, respectively. Additionally, the control circuit 3161 can also include a PMOS transistor M1b and a NMOS transistor M2b, which are serially connected between the first power voltage VDDA and the second power voltage VSSA. The gate of the PMOS transistor M1b is controlled by the output voltage VP1, and the gate of the NMOS transistor M2b is controlled by the bias voltage VB from the first input stage 312. The drains of the PMOS transistor M1b and the NMOS transistor M2b are connected together with the gate of the PMOS transistor M2a at a node P2, which is further coupled to the discharging path 3162. The control circuit 3161 is able to operate in response to the output stage VP1 received from the input stage 212 for controlling the discharging path 3162 via the voltage VP2 at the node P2.

In one embodiment, the discharging path 3162 can include a discharging NMOS transistor Maa that has a drain and source respectively connected with the first output node O1 and the first intermediate power voltage VCA1, and a gate controlled by the control circuit 3161.

The discharging process of the first amplifier circuit 210 is described below. When the level of the first output signal SO1' is above the level of the first input signal SI1, in the first input stage 312, the bias current IB will flow primarily through the PMOS transistor M4 and the NMOS transistor M2, which pulls up the output voltage VP1 at the node P1. Accordingly, in the first output stage 314, the PMOS transistor M7 with its gate connected with the node P1 is deactivated to a higher degree, while the NMOS transistor M6 is activated.

Meanwhile, in the control circuit 3161, the PMOS transistor M1b is also deactivated by the output voltage VP1. As a result, the gate voltage of the PMOS transistor M2a is pulled down, whereas the output voltage VP2 of the control circuit 3161 at the node P2 is pulled up. In response to the rise of the output voltage VP2, the discharging NMOS transistor Maa in the discharging path 3161 is activated. As a result, a discharging current flows from the display panel through the discharging NMOS transistor Maa to the first intermediate power voltage VCA1, whereas another discharging current flows from the display panel through the NMOS transistor M6 to the lower power voltage VSSA1. Consequently, the level of the first output signal SO1' is pulled down. Preferably, for effective reduction of power consumption, the former discharging current flowing through the discharging NMOS transistor Maa can be set much larger (for example, several hundreds times) than the discharging current flowing through the NMOS transistor M6.

Conversely, the charging process of the first amplifier circuit 210 is described below. When the level of the first output signal SO1' is below the level of the first input signal SI1, a charging process of the first amplifier circuit 210 proceeds in a way opposite to the discharging process as described above. Accordingly, in the first output stage 314, the PMOS transistor M7 is activated, while the NMOS transistor M6 is deactivated to a higher degree. Also, the output voltage VP2 from the control circuit 3161 causes the discharging NMOS transistor Maa of the discharging path 3161 to remain deactivated. As a result, a charging current can flow from the upper power voltage VDDA through a charging path formed by the PMOS transistor M7 to the display panel. As a result, the first output signal SO1' is pulled up.

Being bounded between VCA1 and VDDA, the first output voltage from the first amplifier circuit 210 is reduced to a smaller range. As a result, dynamic power consumption can be considerably reduced.

Referring to FIG. 4B, the structure and operation in the second amplifier circuit 220 are similar to the first amplifier circuit 210 of FIG. 4A, with the main difference that all PMOS transistors and NMOS transistors are interchangeably placed. In addition, the first and second power voltage VDDA and VSSA are interchanged, and the first intermediate power voltage VCA1 is replaced with the second intermediate power voltage VCA2. In this embodiment, a PMOS transistor MAA can serve as a charging path 3262, through which a charging current can flow from the second intermediate power voltage VCA2 to the display panel during a charging process.

Bounded between VCA2 and VSSA, the second output voltage range from the second amplifier circuit 220 is smaller, resulting in considerable reduction in dynamic power consumption.

Figure 5A:
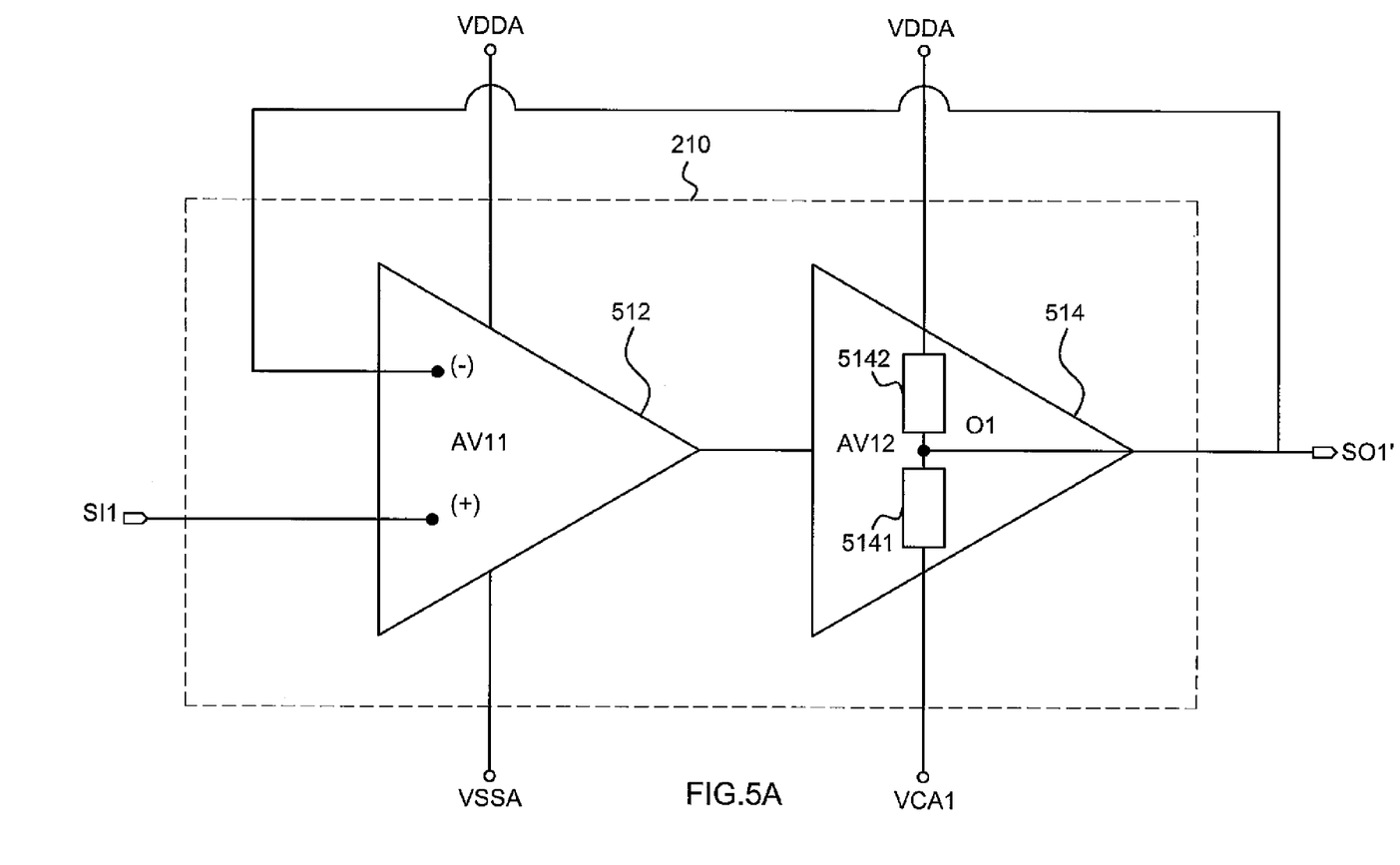
FIGS. 5A and 5B are more detailed schematic diagrams of first and second amplifier circuits of FIG. 2 in accordance with another embodiment.
Figure 5B:
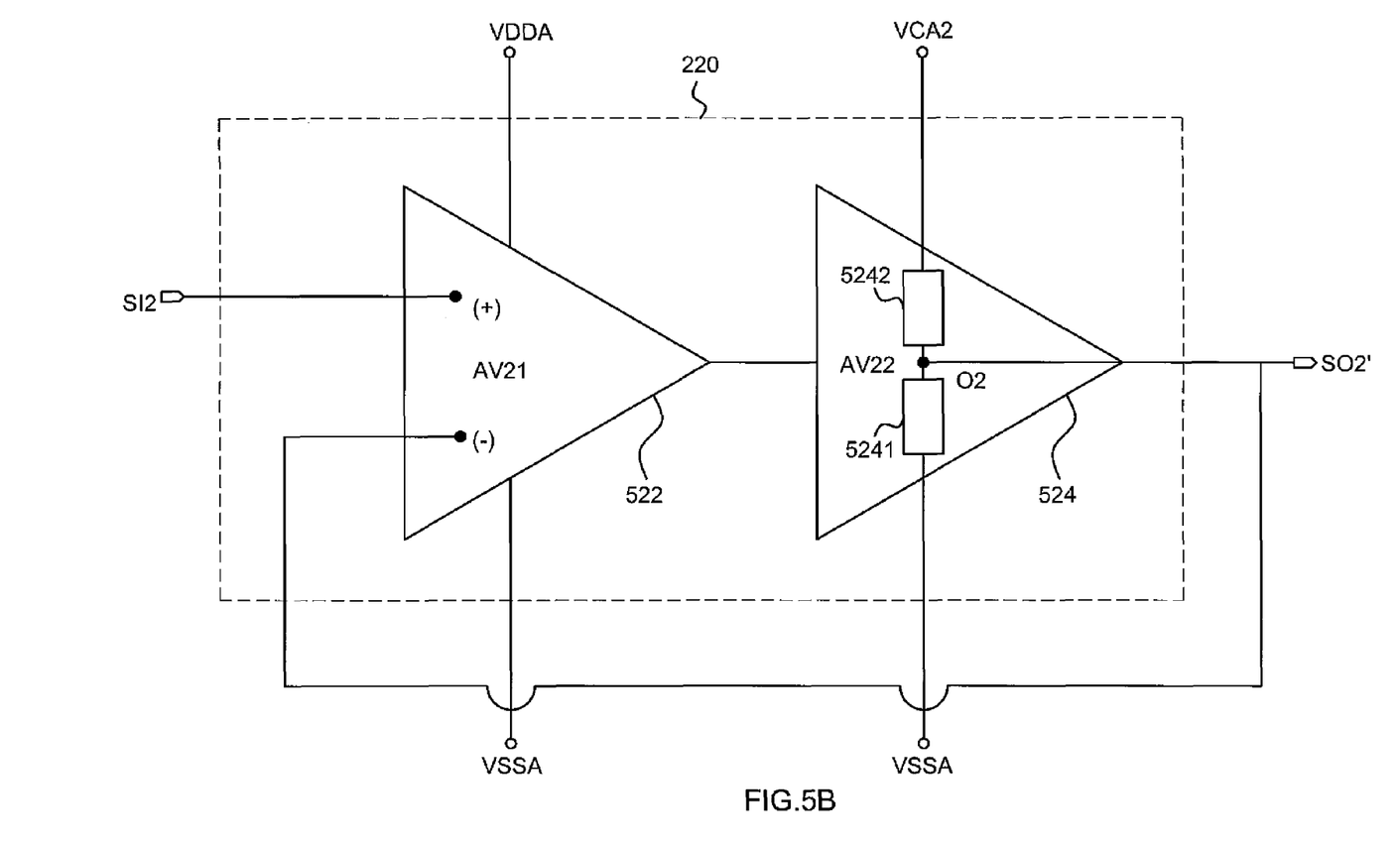

FIGS. 5A and 5B are more detailed schematic diagrams illustrating variant embodiments of the first amplifier circuit 210 and the second amplifier circuit 220 of FIG. 2. Unlike the embodiments shown in FIGS. 3A and 3B, the embodiments illustrated in FIGS. 5A and 5B do not include any assistant discharging/charging units 316/326.

Referring to FIG. 5A, the first amplifier circuit 210 can comprise a first input stage 512 and a first output stage 514. The first input stage 512, coupled between an first power voltage VDDA and a second power voltage VSSA lower than the first power voltage VDDA, can operate in a manner similar to the first input stage 312 previously described in conjunction with FIG. 3A.

The first output stage 514 can include a discharging path 5141 coupled between a first output node O1 and a first intermediate power voltage VCA1, and a charging path 5142 coupled between the first power voltage VDDA and the first output node O1 for driving a display panel within a first output voltage range between the first intermediate power voltage VCA1 and the first power voltage VDDA.

Bounded between VCA1 and VDDA, the first output voltage range is smaller than the output voltage range (bounded between VSSA and VDDA) of the conventional first amplifier circuit 110 of FIG. 1. As a result, less power is consumed during dynamic discharging of the first amplifier circuit 210. It is noted that unlike the first amplifier circuit 210 of FIG. 3A that saves power consumption by use of the assistant discharging unit 316 outside the first output stage 314, power consumption during dynamic discharging of the first amplifier circuit 210 can also be reduced by use of the discharging path 5141 embedded within the first output stage 514, as shown in FIG. 5A.

Referring to FIG. 5B, the second amplifier circuit 220 can comprise a second input stage 522 and a second output stage 524. The second input stage 522, coupled between the first power voltage VDDA and the second power voltage VSSA, can operate in a manner similar to the second input stage 522 previously described in conjunction with FIG. 3B.

The second output stage 524 can include a discharging path 5241 coupled between a second output node O2 and the second power voltage VSSA, and a charging path 5241 coupled between a second intermediate power voltage VCA2 and the second output node O2 for driving a display panel within a second output voltage range between the second intermediate power voltage VCA2 and the second power voltage VSSA.

Having a smaller second output voltage range bounded between VCA2 and VSSA, less power is consumed during dynamic charging of the second amplifier circuit 220. It is worth noting that unlike the second amplifier circuit 210 in FIG. 3B that saves power by placing the assistant charging unit 216 outside the second output stage 324, power consumption can also be reduced during dynamic discharging of the second amplifier circuit 210 by embedding the charging path 5242 in the second output stage 524, as shown in FIG. 5B.

Figure 6A:
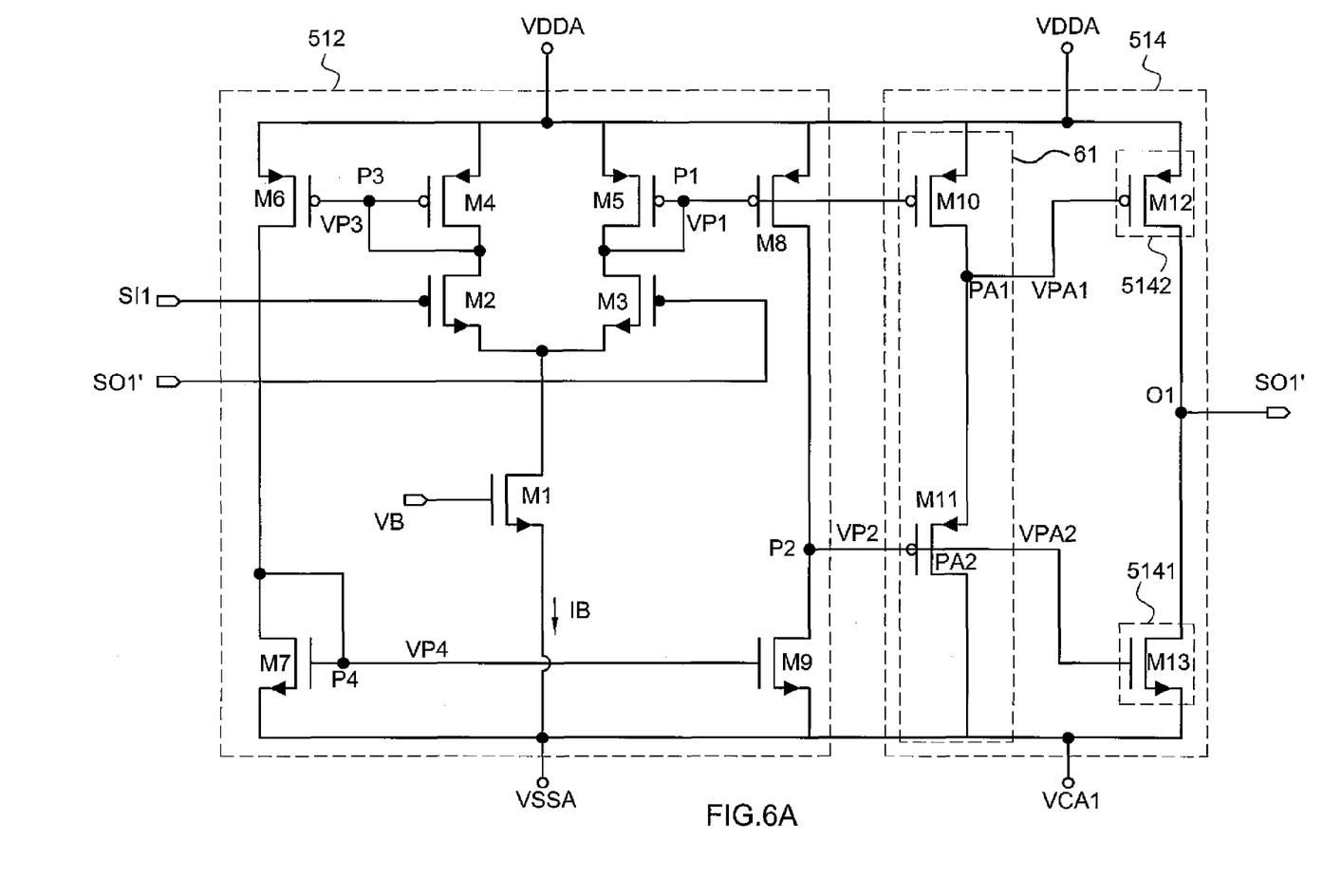
FIGS. 6A and 6B are circuit diagrams of the first amplifier circuit of FIG. 5A and the second amplifier circuit of FIG. 5B in accordance with one embodiment, respectively.
Figure 6B:
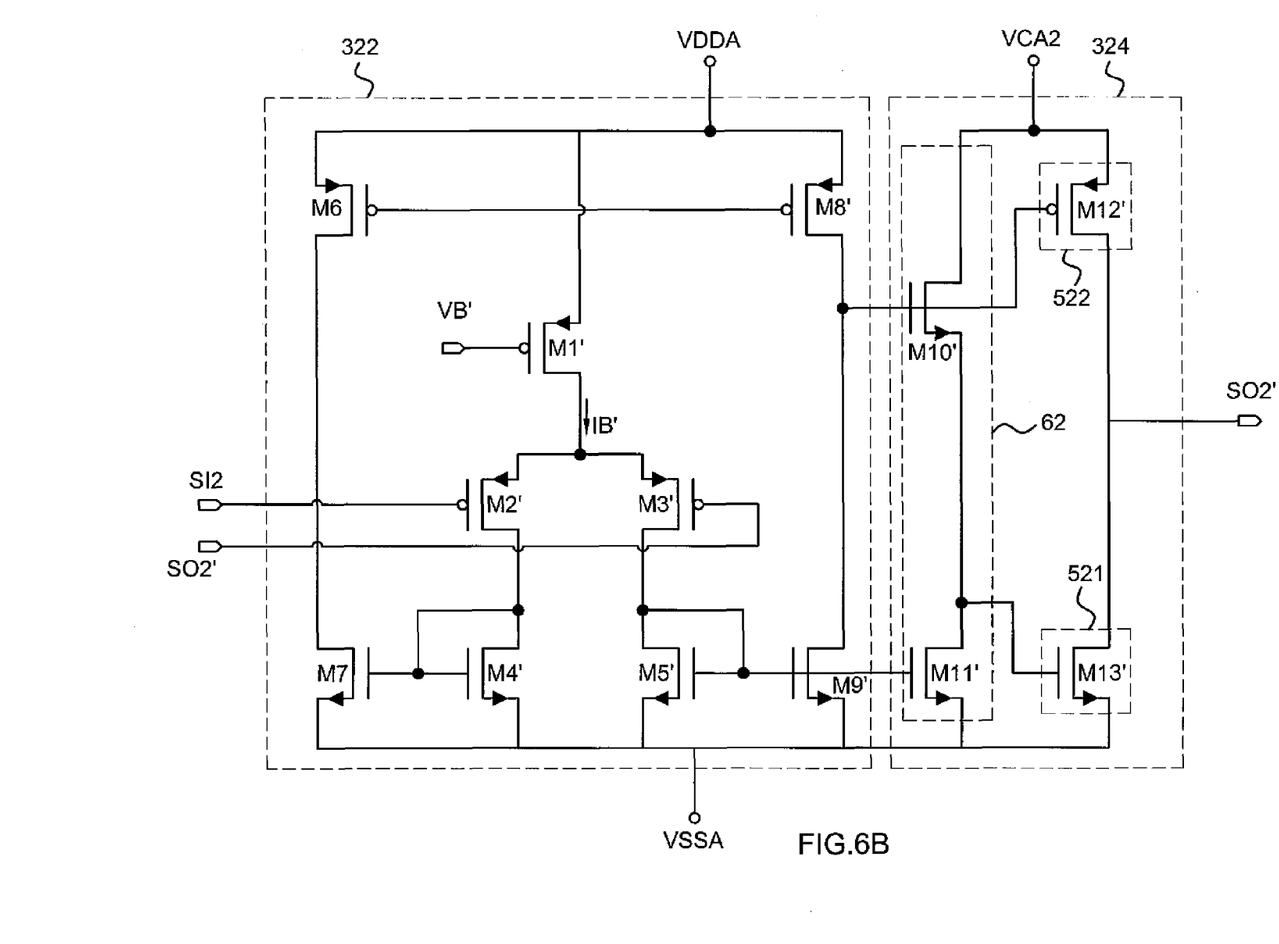

FIGS. 6A and 6B are circuit diagrams illustrating a variant embodiment of the first amplifier circuit 210 of FIG. 5A and a variant embodiment of the second amplifier circuit 220 of FIG. 5B, respectively. Referring to the first amplifier circuit 210 shown in FIG. 6A, a first input stage 512 can include a differential amplifier configured to receive a differential signal (e.g., the first input signal SI1 and the first output signal SO1'), and issue an output voltage VP1 at a node P1 and an output voltage VP2 at a node P2 to the first output stage 514.

In one embodiment, the differential amplifier can include NMOS transistors M2 and M3. The gates of the NMOS transistors M2 and M3 receive the differential signal, the sources of the NMOS transistors M2 and M3 are connected together with a current source providing a bias current IB, and the drains of the NMOS transistors M2 and M3 are connected with first and second active loads. According to one example of implementation, the current source can include a NMOS transistor M1 having a gate connected with a bias voltage VB. The first and second active loads can include a pair of PMOS transistors M4 and M6 and a pair of PMOS transistors M5 and M8, respectively. Additionally, the first and second active loads can be coupled between the first power voltage VDDA and a third active load coupled to a second power voltage VSSA lower than the first power voltage VDDA. The third active load can include NMOS transistors M7 and M9.

The first output stage 514 can include an amplifier, such as a class-AB amplifier as shown. More specifically, the class-AB amplifier can include a level adjusting circuit 61. In one embodiment, the level adjusting circuit 61 can include PMOS transistors M10 and M11, a discharging path 5141 and a charging path 5142. The discharging path 5141 can be implemented via a NMOS transistor M13, whereas the charging path 5142 can be implemented via a PMOS transistor M12. The level adjusting circuit 61 is configured to convert the levels of the output voltages VP1 and VP2 from the first input stage 512 into voltages VPA1 and VPA2 suitable for controlling the transistors M13 and M12. The level adjusting circuit 61 is required because the transistor M13, having a large source-bulk voltage (i.e. VCA1-VSSA), has a large threshold voltage due to a so-called body effect.

The discharging process of the first amplifier circuit 210 is described below. When the level of the first output signal SO1' is above the level of the input signal SI1, the bias current IB will flow primarily through the PMOS transistor M5 and the NMOS transistor M3. As a result, the output voltage VP1 decreases, the voltage VP3 at the node P3 rises, whereas the voltage VP4 of the node P4 decreases. In response to the level changes of the voltages VP1 and VP4, the output voltage VP2 at the node P2 is pulled up. Accordingly, in the level adjusting circuit 61, the voltage VPA1 at a node PA1 and the voltage VPA2 at a node PA2 are both pulled up. As a result, the PMOS transistor M12 is deactivated while the NMOS transistor M13 is activated, which forms the discharging path 5141 of FIG. 5A allowing a discharging current to flow from the display panel to the first intermediate power voltage VCA1.

Conversely, when the first output signal SO1' is below the first input signal SI1, a charging process of the first amplifier circuit 210 proceeds in a way opposite to the discharging process described above. More specifically, in the charging process, the NMOS transistor M13 is deactivated, while the PMOS transistor M12 is activated to form the charging path 5142 of FIG. 5A that allows a charging current to flow from the first power voltage VDDA to the display panel.

Referring to FIG. 6B, the structure and operation of the second amplifier circuit 220 are similar to the first amplifier circuit 220 of FIG. 6A, with the main difference that all PMOS transistors and NMOS transistors are interchangeable placed. In addition, the first and second power voltage VDDA and VSSA are interchanged, and the first intermediate power voltage VCA1 is replaced with the second intermediate power voltage VCA2. In this embodiment, a PMOS transistor M12' can serve as a charging path 5242, through which a charging current can flow from the second intermediate power voltage VCA2 to the display panel during a charging process. Additionally, a NMOS transistor M13' can be activated to form a discharging path 5241 that allows a discharging current to flow from the display panel to the second power voltage VSSA.

Figure 7:
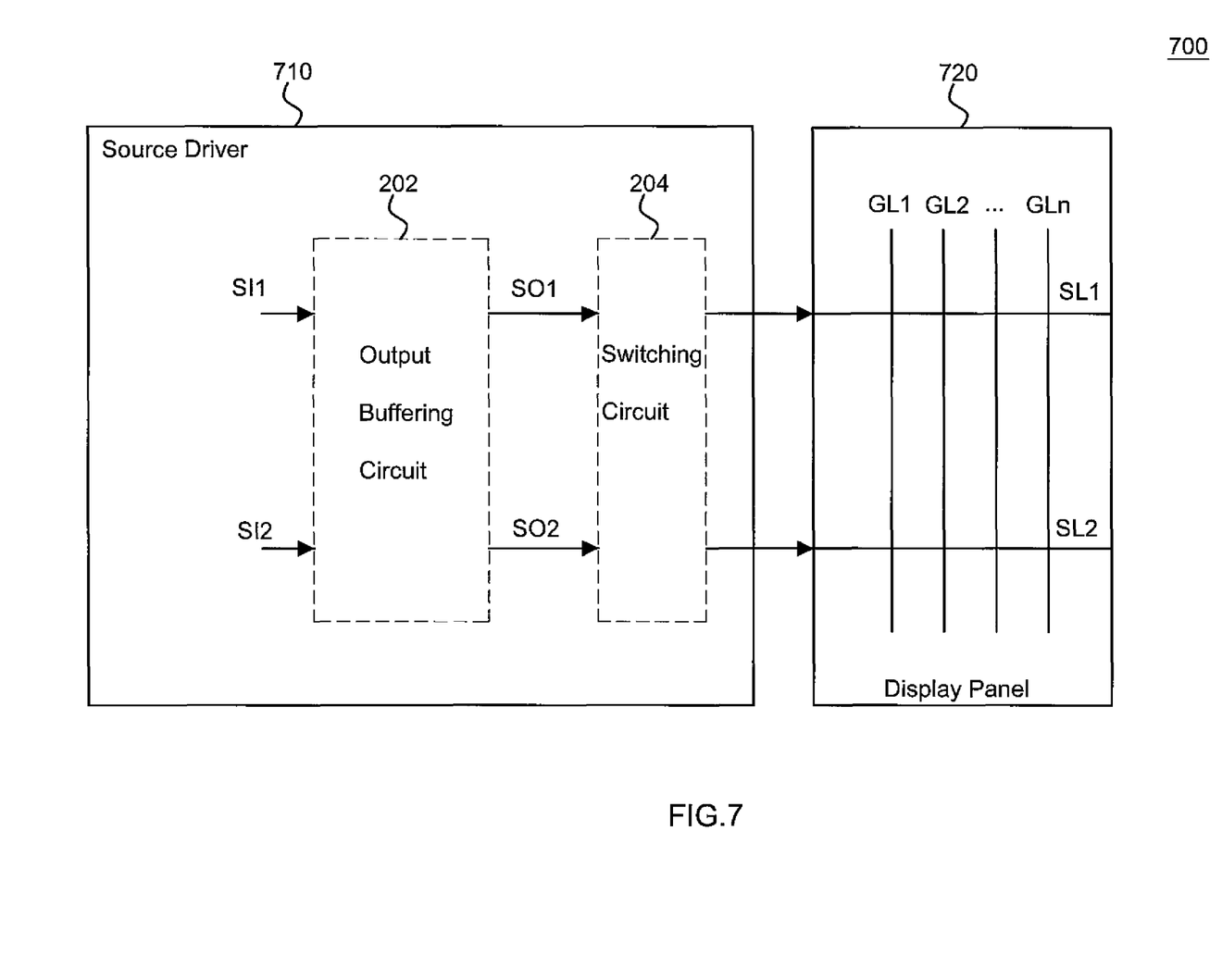
FIG. 7 is a schematic block diagram of an exemplary display device according to one embodiment.

FIG. 7 is a schematic block diagram of a display device employing the source driver device 200 of FIG. 2 according to one embodiment. As shown, a display device 700 can include a source driver 710 and a display panel 720. The display panel 720 can include a plurality of source lines, e.g., source lines SL1 and SL2, and a plurality of gate lines, e.g, GL1-GLn, where n is a non-zero integer. The source driver 710 can be configured according to any of the embodiments illustrated previously in connection with FIGS. 2-6B for driving the source lines on the display panel 720.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. An output buffering circuit of a driver device for a display device, comprising:
 a first amplifier circuit comprising:
  a first input stage coupled between a first power voltage and a second power voltage lower than the first power voltage, wherein the first input stage includes a differential transistor pair that is connected with a circuit node, the differential transistor pair being operable to receive a differential signal pair and provide an output signal;
  a first output stage coupled between the first power voltage and the second power voltage, and having a first output node; and
  an assistant discharging unit coupled between the first output node and a first intermediate power voltage higher than the second power voltage, wherein the assistant discharging unit is configured to provide a discharging current from the first output node to the first intermediate power voltage during a discharging operation of the first amplifier circuit; and
 a second amplifier circuit comprising:
  a second input stage coupled between the first power voltage and the second power voltage;
  a second output stage coupled between the first power voltage and the second power voltage, and having a second output node; and
  an assistant charging unit coupled between the second output node and a second intermediate power voltage lower than the first power voltage, wherein the assistant charging unit is configured to provide a charging current flowing from the second intermediate power voltage to the second output node during a charging operation of the second amplifier circuit;
 wherein the assistant discharging unit includes a discharging transistor connected between the first output node of the first output stage and the first intermediate power voltage, and a control circuit connected with a gate of the discharging transistor, the control circuit including:
  a first, a second and a third transistor that are connected with one another in series between the first power voltage and the circuit node of the first input stage; and
  a fourth and a fifth transistor that are connected with each other in series between the first power voltage and the second power voltage, wherein a gate of the fourth transistor is controlled by the output signal of the first input stage, drains of the fourth and fifth transistors are respectively connected with a gate of the second transistor, and a connection node between the second and third transistors is coupled with the gate of the discharging transistor.

2. The output buffering circuit of claim 1, wherein a discharging path is configured to activate and deactivate during a discharging operation and a charging operation of the first amplifier circuit, respectively.

3. The output buffering circuit of claim 1, wherein the assistant charging unit comprises:
   a charging path coupled between the second intermediate power voltage and the second output node, wherein the charging path is configured to activate and deactivate during a charging operation and a discharging operation of the second amplifier circuit, respectively; and
   a second control circuit configured to control the charging path.

4. The output buffering circuit of claim 1, wherein the discharging transistor is a NMOS transistor.

5. The output buffering circuit of claim 3, wherein the charging path comprises a PMOS transistor having a gate controlled by the second control circuit.

6. The output buffering circuit of claim 1, wherein each of the first and second input stages comprises a differential amplifier.

7. The output buffering circuit of claim 1, wherein each of the first and second output stages comprises a pair of complementary transistors that are serially connected between the first power voltage and the second power voltage.

8. An amplifier device comprising:
   an input stage coupled between a first and a second power voltage different from each other, wherein the input stage includes a differential transistor pair and a current source that are connected with each other at a circuit node, the differential transistor pair being operable to receive a differential signal pair and provide an output signal;
   an output stage coupled between the first and second power voltages and having an output node; and
   an assistant discharging unit or an assistant charging unit coupled between the output node and a respective intermediate power voltage being between the first and second power voltages, the assistant discharging or charging unit respectively being configured to provide a corresponding discharging or charging current between the output node and the respective intermediate power voltage;
   wherein the assistant discharging or charging unit includes a respective discharging or charging transistor connected between the output node of the output stage and the respective intermediate power voltage, and a control circuit connected respectively with a gate of the discharging or charging transistor, the control circuit including:
   a first, a second and a third transistor that are connected with one another in series respectively between the first power voltage in the assistant discharging unit or the second power voltage in the assistant charging unit and the circuit node of the input stage; and
   a fourth and a fifth transistor that are connected with each other in series between the first power voltage and the second power voltage, wherein a gate of the fourth transistor is respectively controlled by the output signal of the input stage in the assistant discharging or charging unit, drains of the fourth and fifth transistors are respectively connected with a respective gate of the second transistor in the assistant discharging or charging unit, and a respective connection node between the second and third transistors in the assistant discharging or charging unit, is coupled with the respective gate of the discharging or charging transistor in the assistant discharging or charging unit.

9. A display device comprising:
   a display panel having a plurality of source lines; and
   a source driver having the output buffering circuit of claim 1.

10. The output buffering circuit of claim 1, wherein the first, second and fourth transistors are PMOS transistors, and the third and fifth transistors are NMOS transistors.

11. The output buffering circuit of claim 1, wherein the differential signal pair includes a first signal that is applied to the differential transistor and a gate of the third transistor, and a second signal available at the first output node.

12. The output buffering circuit of claim 1, wherein the first input stage further includes a current source connected with the circuit node.

13. The output buffering circuit of claim 12, wherein the current source includes a sixth transistor connected between the circuit node and the second power voltage.

14. The output buffering circuit of claim 1, wherein the differential transistor pair has two drains respectively connected with an active load that includes a seventh and an eighth transistor connected with the first power voltage.

15. The output buffering circuit of claim 14, wherein the seventh and eighth transistors are PMOS transistors having drains connected with the first power voltage, and sources connected with the drains of the differential transistor pair.

16. The amplifier device of claim 8, wherein the first, second and fourth transistors are PMOS transistors, and the third and fifth transistors are NMOS transistors in the assistant discharging unit.

17. The amplifier device of claim 8, wherein the first, second and fourth transistors are NMOS transistors, and the third and fifth transistors are PMOS transistors in the assistant charging unit.

18. The amplifier device of claim 8, wherein the differential signal pair includes a first signal that is applied to the differential transistor and a gate of the third transistor, and a second signal available at the output node.

19. The amplifier device of claim 8, wherein the current source includes a sixth transistor connected between the circuit node and the second power voltage.

20. The amplifier device of claim 8, wherein the differential transistor pair has two drains respectively connected with an active load including a seventh and an eighth transistor.

21. The amplifier device of claim 20, wherein the seventh and eighth transistors are PMOS transistors having drains connected with the first power voltage, and sources connected with the drains of the differential transistor pair.

* * * * *